United States Patent
Wang et al.

(10) Patent No.: US 9,735,278 B2
(45) Date of Patent: Aug. 15, 2017

(54) ARRAY SUBSTRATE, DISPLAY PANEL AND METHOD OF MANUFACTURING THIN FILM TRANSISTOR

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Wu Wang, Beijing (CN); Haijun Qiu, Beijing (CN); Fei Shang, Beijing (CN); Guolei Wang, Beijing (CN)

(73) Assignees: BOE TECHNOLOGY GROUP CO., LTD., Beijing (CN); CHONGQING BOE OPTOELECTRONICS TECHNOLOGY CO., LTD., Beibei, Chongqing (CN)

( * ) Notice: Subject to any disclaimer, the term of this patent is extended or adjusted under 35 U.S.C. 154(b) by 0 days.

(21) Appl. No.: 14/744,557

(22) Filed: Jun. 19, 2015

(65) Prior Publication Data

US 2016/0118415 A1 Apr. 28, 2016

(30) Foreign Application Priority Data

Oct. 27, 2014 (CN) .......................... 2014 1 0584222

(51) Int. Cl.
 *H01L 27/12* (2006.01)
 *H01L 29/786* (2006.01)
(52) U.S. Cl.
 CPC .... *H01L 29/78642* (2013.01); *H01L 27/1222* (2013.01)
(58) Field of Classification Search
 CPC ............. H01L 29/78642; H01L 27/124; H01L 27/2454; H01L 27/249; H01L 29/66742;
 (Continued)

(56) References Cited

U.S. PATENT DOCUMENTS

2006/0175609 A1* 8/2006 Chan ................ H01L 29/66787
 257/59
2013/0038517 A1* 2/2013 Kang ................ H01L 29/78642
 345/92
(Continued)

FOREIGN PATENT DOCUMENTS

CN 1230791 A 10/1999
CN 1738058 A 2/2006

OTHER PUBLICATIONS

First Chinese Office Action dated Nov. 1, 2016; Appln. No. 201410584222.2.

(Continued)

*Primary Examiner* — Edward Chin
(74) *Attorney, Agent, or Firm* — Ladas & Parry LLP

(57) ABSTRACT

An array substrate, a display panel and a method of manufacturing a thin film transistor (TFT) are provided. The array substrate includes a base substrate and a thin film transistor (TFT) formed on the base substrate, and the TFT includes a gate electrode, a gate insulating layer, an active layer, source/drain electrodes and an interlayer insulating layer. The source/drain electrodes include a first electrode and a second electrode, and the interlayer insulating layer is located between the first electrode and the second electrode. The gate electrode, the gate insulating layer and the active layer are arranged sequentially in a direction perpendicular to a thickness direction of the array substrate, and the first electrode, the interlayer insulating layer and the second electrode are arranged sequentially in the thickness direction of the array substrate.

14 Claims, 2 Drawing Sheets

(58) Field of Classification Search
CPC ......... H01L 29/66787; H01L 29/78696; H01L 45/1226; H01L 45/142; H01L 45/143; H01L 45/146; H01L 45/147; H01L 45/149
USPC .......... 257/E21.442, E27.112, E29.274, 314, 257/347, 59, 72; 438/149, 156
See application file for complete search history.

(56) References Cited

U.S. PATENT DOCUMENTS

2015/0255619 A1* 9/2015 Shimabukuro ... H01L 29/78642
257/314
2016/0118415 A1* 4/2016 Wang .................. H01L 27/1214
257/329

OTHER PUBLICATIONS

Second Chinese Office Action dated Apr. 12, 2017; Appln. No. 201410584222.2.

\* cited by examiner

ARRAY SUBSTRATE, DISPLAY PANEL AND METHOD OF MANUFACTURING THIN FILM TRANSISTOR

TECHNICAL FIELD

Embodiments of the present invention relate to an array substrate, a display panel and a method of manufacturing a thin film transistor.

BACKGROUND

In the field of display technologies, the opening area in the pixel unit of a liquid crystal display panel is a main factor affecting the improvement of display quality.

In the prior art, each pixel unit of the liquid display panel is disposed with a thin film transistor (TFT). The source electrode and the drain electrode in the TFT are formed through one patterning process, and the source electrode and the drain electrode and the channel therebetween are arranged in a direction perpendicular to the thickness direction of the array substrate.

In the above TFT, in the arrangement direction of the source electrode and the drain electrode, the size of TFT comprises the width of the source electrode, the width of the source electrode, and the width of the channel between the source electrode and the drain electrode. As the manufacturing for the TFT is restrained by the resolution of an exposure machine, the width of the channel between the source electrode and the drain electrode cannot be too small, and therefore, the width of TFT in the direction perpendicular to the thickness direction of the substrate cannot be too small, and it is not good for improving the opening ratio of the pixel unit.

SUMMARY

An array substrate, comprising: a base substrate and a thin film transistor (TFT) formed on the base substrate, the TFT comprising a gate electrode, a gate insulating layer, an active layer, source/drain electrodes and an interlayer insulating layer, wherein, the source/drain electrodes comprise a first electrode and a second electrode, and the interlayer insulating layer is located between the first electrode and the second electrode; the gate electrode, the gate insulating layer and the active layer are arranged sequentially in a direction perpendicular to a thickness direction of the array substrate; the first electrode, the interlayer insulating layer and the second electrode are located at a side of the active layer away from the gate insulating layer; the first electrode, the interlayer insulating layer and the second electrode are arranged sequentially in the thickness direction of the array substrate, and the second electrode is located at a side of the first electrode away from the base substrate of the array substrate.

A display panel comprises the above array substrate.

A method of manufacturing a thin film transistor (TFT), comprising: forming a pattern of a gate electrode on a base substrate; forming a pattern of a gate insulating layer at a side of the gate electrode in a direction perpendicular to a thickness direction of the base substrate; forming a pattern of an active layer at a side of the gate insulating layer away from the gate electrode in the direction perpendicular to the thickness direction of the base substrate; forming a pattern of a first electrode at a side of the active layer away from the gate electrode in the direction perpendicular to the thickness direction of the base substrate; forming a pattern of an interlayer insulating layer at a side of the first electrode away from the base substrate in the thickness direction of the base substrate; and forming a pattern of a second electrode at a side of the insulating layer away from the first electrode in the thickness direction of the base substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
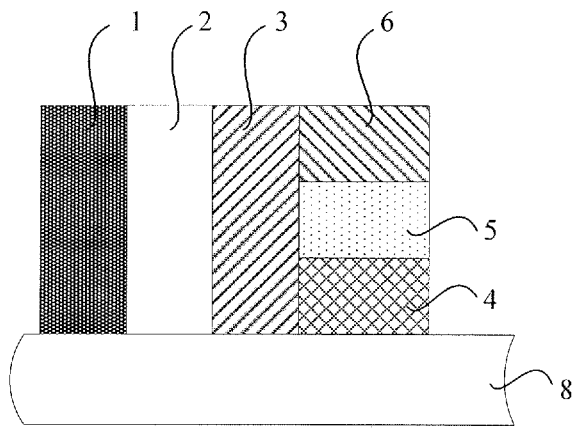
FIG. 1 is a structural schematic view of a thin film transistor (TFT) according to an embodiment of the present invention.

Please refer to FIG. 1. As illustrated in FIG. 1, a thin film transistor (TFT) of an array substrate provided by embodiments of the present invention comprises a gate electrode 1, a gate insulating layer 2, an active layer 3, source/drain electrodes and an insulating layer (interlayer insulating layer) 5. The source/drain electrodes comprise a first electrode 4 and a second electrode 6, and the insulating layer 5 is located between the first electrode 4 and the second electrode 6. The gate electrode 1, the gate insulating layer 2 and the active layer 3 are arranged in a direction perpendicular to the thickness direction of the array substrate (that is, a direction parallel to the plane of the array substrate). That is, as illustrated in FIG. 1, the gate electrode 1, the gate insulating layer 2 and the active layer 3 are arranged in a direction perpendicular to the thickness direction of the base substrate 8 of the array substrate. The first electrode 4, the insulating layer 5 and the second electrode 6 are located at one side of the active layer 3 away from the gate insulating layer 2. The first electrode 4, the insulating layer 5 and the second electrode 6 are arranged in the thickness direction of the array substrate, and the second electrode 6 is located at one side of the first electrode 4 away from the array substrate base substrate 8.

Figure 2:
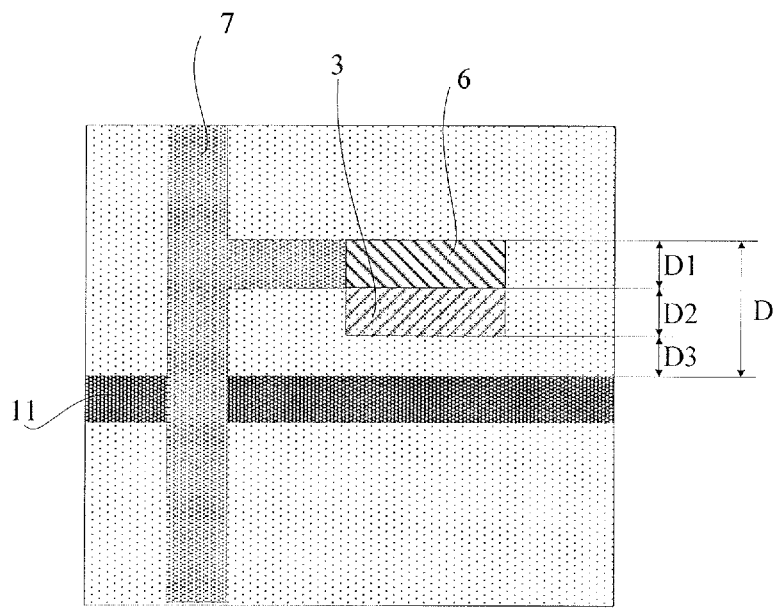
FIG. 2 is a structural schematic view of an array substrate according to an embodiment of the present invention.

In the above TFT, as illustrated in FIG. 1, the gate electrode 1, the gate insulating layer 2 and the active layer 3 are arranged in a direction perpendicular to the thickness direction of the array substrate, the first electrode 4, the insulating layer 5 and the second electrode 6 are arranged in the thickness direction the array substrate, and therefore, the first electrode 4, the second electrode 6 and the channel between the first electrode 4 and the second electrode 6 are arranged in the thickness direction of the array substrate. As illustrated in FIG. 2, the width D of the above TFT in a pixel unit is mainly affected by a width D3 of the gate insulating layer 2, a width D2 of the active layer 3 and a width D1 of the second electrode 6. When the gate electrode 1 is formed by the portion of the gate line 11 directly opposed to the active layer 3, as illustrated in FIG. 1, the width D of the above TFT in the pixel unit is the sum of the width D3 of the gate insulating layer 2, the width D2 of the active layer 3 and the width D1 of the second electrode 6. As the widths of the gate insulating layer 2, the active layer 3 and the second electrode 6 in the direction perpendicular to the array substrate are not affected by the resolution of the exposure machine, in the above TFT, the widths of the gate insulating layer 2, the active layer 3 and the second electrode 6 in the arrangement direction of the gate electrode 1, the gate insulating layer 2 and the active layer 3 can be made relative small so as to improve the opening ratio of the pixel unit.

As illustrated in FIG. 1, the size of the height of the gate electrode 1, the gate insulating layer 2 and the active layer 3 measured in the direction parallel to the thickness direction of the array substrate is greater than that measured in the direction perpendicular to the thickness direction of the array substrate.

In one example, the above first electrode 4 is a drain electrode and the second electrode 6 is a source electrode.

In another example, the first electrode 4 is a source electrode and the second electrode 6 is a drain electrode.

According to one embodiment of the present invention, a TFT switch of the array substrate comprises a gate electrode, a gate insulating layer, an active layer, source/drain electrodes and an insulating layer. The source/drain electrodes comprise a first electrode and a second electrode, and the insulating layer is located between the first electrode and the second electrode; the gate electrode, the gate insulating layer and the active layer are arranged sequentially in a direction perpendicular to the thickness direction of the array substrate; the first electrode, the insulating layer and the second electrode are located at one side of the active layer away from the gate insulating layer. The first electrode, the insulating layer and the second electrode are arranged sequentially in the thickness direction of the array substrate, and the second electrode is located at one side of the first electrode away from the array substrate base substrate.

Please further refer to FIG. 1, one embodiment of the present invention provides an array substrate, comprising a base substrate 8, and further comprising any TFT provided in the above embodiments, and the TFT is provided on the base substrate 8.

For example, as illustrated in FIG. 1, the sum of the sizes of the first electrode 4, the second electrode 6 and the interlayer insulating layer 5 measured in the direction parallel to the thickness direction of the array substrate is substantially equivalent to the size of the height of the active layer measured in the direction parallel to the thickness direction of the array substrate.

As illustrated in FIG. 2, the width D of the above TFT in a pixel unit is mainly affected by the width D3 of the gate insulating layer 2, the width D2 of the active layer 3 and the width D1 of the second electrode 6. When the gate electrode 1 is formed by the portion of the gate line 11 directly opposed to the active layer 3, as illustrated in FIG. 1, the width D of the above TFT in the pixel unit is the sum of the width D3 of the gate insulating layer 2, the width D2 of the active layer 3 and the width D1 of the second electrode 6. As the widths of the gate insulating layer 2, the active layer 3 and the second electrode 6 in the direction perpendicular to the thickness direction of the array substrate are not affected by the resolution of the exposure machine, in the above TFT, the widths of the gate insulating layer 2, the active layer 3 and the second electrode 6 in the direction perpendicular to the array substrate can be made relative small so as to improve the opening ratio of the pixel unit.

In addition, as illustrated in FIG. 1, the distance between the source electrode 4 and the drain electrode 6 is the length of the channel. According to the TFT of the embodiments of the present invention, the length of the channel is determined by the thickness of the interlayer insulating layer 5 while not affected by the resolution of the exposure machine; therefore, the length of the channel of the TFT can be reduced.

Another embodiment of the present invention further provides a display panel, comprising the array substrate provided in the above embodiments.

Figure 3:
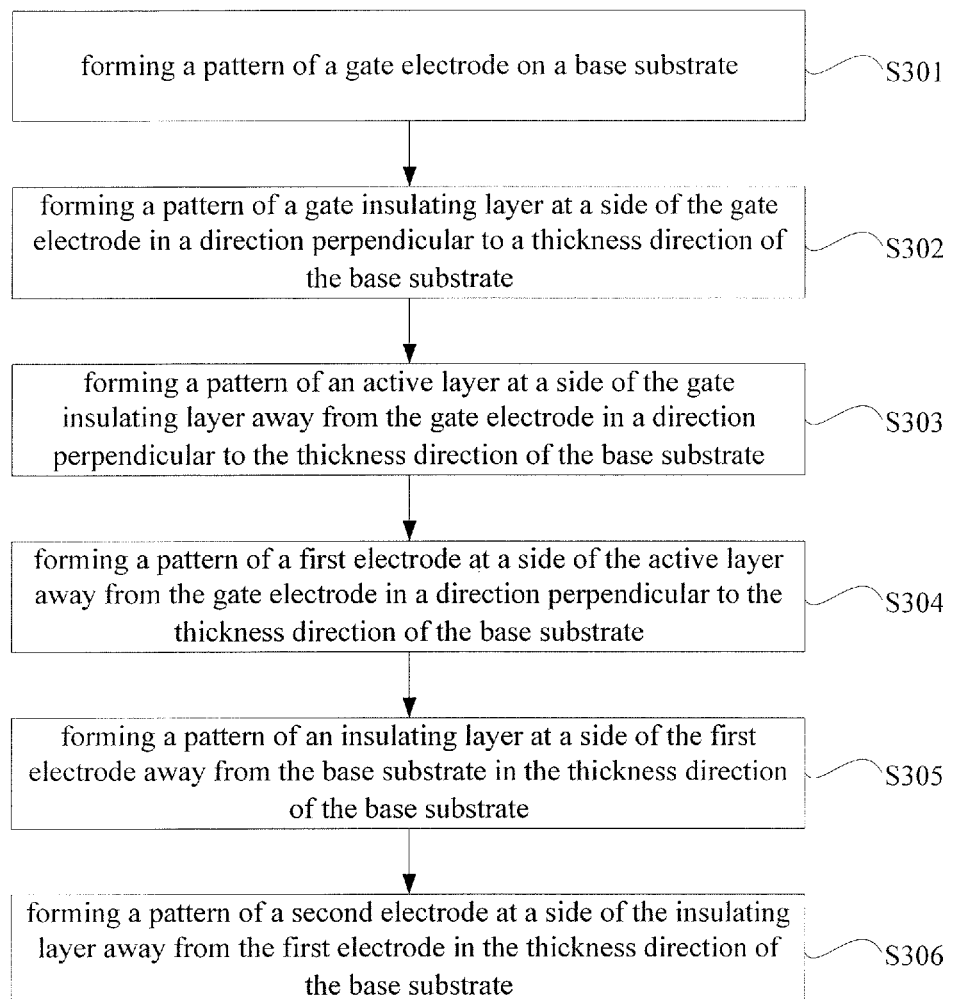
FIG. 3 is a flow diagram of a method of manufacturing a TFT according to an embodiment of the present invention.

As illustrated in FIG. 3, an embodiment of the present invention provides a method of manufacturing a TFT provided in the above embodiments, comprising:

step S301, forming a pattern of a gate electrode on a base substrate;

step S302, forming a pattern of a gate insulating layer at a side of the gate electrode in a direction perpendicular to a thickness direction of the base substrate;

step S303, forming a pattern of an active layer at a side of the gate insulating layer away from the gate electrode in a direction perpendicular to the thickness direction of the base substrate;

step S304, forming a pattern of a first electrode at a side of the active layer away from the gate electrode in a direction perpendicular to the thickness direction of the base substrate;

step S305, forming a pattern of an insulating layer at a side of the first electrode away from the base substrate in the thickness direction of the base substrate; and step S306, forming a pattern of a second electrode at a side of the insulating layer away from the first electrode in the thickness direction of the base substrate.

In some embodiments, the above step S301 comprises:

forming a gate metal layer on the base substrate, and forming the pattern of the gate line and the pattern of the gate electrode by a patterning process. For example, the pattern of the gate electrode is a portion of the gate pattern, e.g., a portion in the pattern of the gate line directly opposed to the pattern of the active layer manufactured in the following steps, which can further reduce the width of the TFT in the pixel in the direction perpendicular to the thickness direction of the base substrate and perpendicular to the pattern of the gate line.

In some embodiment, the above step S302 can further comprise:

forming a gate insulating material layer on the pattern of the gate line and the pattern of the gate electrode, and forming a hollowed area for disposing the first electrode, the second electrode and the insulating layer in the direction perpendicular to the thickness direction of the base substrate and at a side of the gate electrode by the patterning process, and forming the portion of the gate insulating material layer located between the gate electrode and the hollowed area into the pattern of the gate insulating layer. The gate insulating layer is directly formed by the gate insulating material layer, which can simplify the manufacturing process of the array substrate.

In some embodiment, when the first electrode is the source electrode and the second electrode is the drain electrode, the above step S304 can further comprise:

forming a data metal layer on the gate insulating layer, and forming the pattern of a data line 7 and the pattern of the source electrode by a patterning process. In the above process, the source electrode and the data line are formed by a one patterning process, and the formed source electrode is in direct electrical connection with the data line, which can simplify the manufacturing process of the array substrate.

In some embodiments, the above step S305 can comprise: forming a passivation layer on the pattern of the data line and the pattern of the source electrode, and forming the portion of the passivation layer in the hollowed area into the insulating layer.

The foregoing is merely exemplary embodiments of the invention, but is not used to limit the protection scope of the invention. The protection scope of the invention shall be defined by the attached claims.

The present application claims the priority of the Chinese patent application No. 201410584222.2, filed on Oct. 27, 2014, which is incorporated herein on its entirety as a part of the present application.

The invention claimed is:

1. An array substrate, comprising: a base substrate and a thin film transistor (TFT) formed on the base substrate, the TFT comprising a gate electrode, a gate insulating layer, an active layer, source/drain electrodes and an interlayer insulating layer,
wherein, the source/drain electrodes comprise a first electrode and a second electrode, and the interlayer insulating layer is located between the first electrode and the second electrode; the gate electrode, the gate insulating layer and the active layer are arranged sequentially in a direction perpendicular to a thickness direction of the array substrate; the first electrode, the interlayer insulating layer and the second electrode are located at a side of the active layer away from the gate insulating layer; the first electrode, the interlayer insulating layer and the second electrode are arranged sequentially in the thickness direction of the array substrate, and the second electrode is located at a side of the first electrode away from the base substrate of the array substrate,
wherein a thickness direction of each of the gate electrode, the gate insulating layer and the active layer is continuously perpendicular to the thickness direction of the array substrate.

2. The array substrate according to claim 1, wherein, one of the first electrode and the second electrode is a drain electrode, and the other one of the first electrode and the second electrode is a source electrode.

3. The array substrate according to claim 1, wherein, a size of the gate electrode, the gate insulating layer and the active layer measured in a direction parallel to the thickness direction of the array substrate is greater than that measured in the direction perpendicular to the thickness direction of the array substrate.

4. The array substrate according to claim 3, wherein, a sum of sizes of the first electrode, the second electrode and the interlayer insulating layer measured in the direction parallel to the thickness direction of the array substrate is substantially equivalent to the size of the active layer measured in the direction parallel to the thickness direction of the array substrate.

5. A display panel, comprising the array substrate according to claim 1.

6. The display panel according to claim 5, wherein, one of the first electrode and the second electrode is a drain electrode, and the other one of the first electrode and the second electrode is a source electrode.

7. The display panel according to claim 5, wherein, a size of the gate electrode, the gate insulating layer and the active layer measured in a direction parallel to the thickness direction of the array substrate is greater than that measured in the direction perpendicular to the thickness direction of the array substrate.

8. The display panel according to claim 7, wherein, a sum of sizes of the first electrode, the second electrode and the interlayer insulating layer measured in the direction parallel to the thickness direction of the array substrate is substantially equivalent to the size of the active layer measured in the direction parallel to the thickness direction of the array substrate.

9. A method of manufacturing a thin film transistor (TFT), comprising:
forming a pattern of a gate electrode on a base substrate;
forming a pattern of a gate insulating layer at a side of the gate electrode in a direction perpendicular to a thickness direction of the base substrate;
forming a pattern of an active layer at a side of the gate insulating layer away from the gate electrode in the direction perpendicular to the thickness direction of the base substrate;
forming a pattern of a first electrode at a side of the active layer away from the gate electrode in the direction perpendicular to the thickness direction of the base substrate;
forming a pattern of an interlayer insulating layer at a side of the first electrode away from the base substrate in the thickness direction of the base substrate; and
forming a pattern of a second electrode at a side of the insulating layer away from the first electrode in the thickness direction of the base substrate,
wherein a thickness direction of each of the gate electrode, the gate insulating layer and the active layer is continuously perpendicular to the thickness direction of the base substrate.

10. The manufacturing method according to claim 9, wherein, forming the pattern of the gate electrode on the base substrate comprises:
forming a gate metal layer on the base substrate, and forming the pattern of a gate line and the pattern of the gate electrode by a patterning process.

11. The manufacturing method according to claim 10, wherein, forming the pattern of the gate insulating layer at the side of the gate electrode in the direction perpendicular to the thickness direction of the base substrate comprises:
forming a gate insulating material layer on the pattern of the gate line and the pattern of the gate electrode, and forming a hollowed area for disposing the first electrode, the second electrode and the interlayer insulating layer at a side of the gate electrode in the direction perpendicular to the thickness direction of the base substrate by a patterning process, and forming a portion of the gate insulating material layer located between the gate electrode and the hollowed area into the pattern of the gate insulating layer.

12. The manufacturing method according to claim 11, wherein, the first electrode is a source electrode and the second electrode is a drain electrode, and the step of forming the pattern of the first electrode at the side of the active layer away from the gate electrode in the direction perpendicular to the thickness direction of the base substrate comprises:
forming a data metal layer on the gate insulating layer, and forming the pattern of a data line and the pattern of the source electrode by a patterning process.

13. The manufacturing method according to claim 12, wherein, the step of forming the pattern of the interlayer insulating layer at the side of the first electrode away from the base substrate in the thickness direction of the base substrate comprises:

forming a passivation layer on the pattern of the data line and the pattern of the source electrode, and forming a portion of the passivation layer in the hollowed area into the interlayer insulating layer.

14. The manufacturing method according to claim 12, wherein, a sum of sizes of the first electrode, the second electrode and the interlayer insulating layer measured in the direction parallel to the thickness direction of the array substrate is substantially equivalent to a size of the active layer measured in the direction parallel to the thickness direction of the array substrate.

* * * * *